United States Patent
Kitajima et al.

(10) Patent No.: US 10,522,482 B2
(45) Date of Patent: Dec. 31, 2019

(54) SEMICONDUCTOR DEVICE MANUFACTURING METHOD COMPRISING BONDING AN ELECTRODE TERMINAL TO A CONDUCTIVE PATTERN ON AN INSULATING SUBSTRATE USING ULTRASONIC BONDING

(71) Applicant: Mitsubishi Electric Corporation, Tokyo (JP)

(72) Inventors: Yumie Kitajima, Tokyo (JP); Tatunori Yanagimoto, Tokyo (JP); Kiyoshi Arai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/237,311

(22) Filed: Dec. 31, 2018

(65) Prior Publication Data

US 2019/0139906 A1    May 9, 2019

Related U.S. Application Data

(63) Continuation of application No. 15/324,011, filed as application No. PCT/JP2014/072594 on Aug. 28, 2014, now abandoned.

(51) Int. Cl.
*H01L 21/48* (2006.01)
*H01L 23/495* (2006.01)
(Continued)

(52) U.S. Cl.
CPC ........ *H01L 23/562* (2013.01); *H01L 21/4825* (2013.01); *H01L 21/4839* (2013.01);
(Continued)

(58) Field of Classification Search
CPC ............. H01L 21/4825; H01L 21/4839; H01L 23/495; H01L 23/49537; H01L 23/49551; H01L 23/49555; H01L 25/162
See application file for complete search history.

(56) References Cited

U.S. PATENT DOCUMENTS

| 8,796,563 B2 | 8/2014 | Ikeda et al. |
| 2004/0029312 A1 | 2/2004 | Knapp et al. |

(Continued)

FOREIGN PATENT DOCUMENTS

| CN | 103390597 A | 11/2013 |
| DE | 102012224356 A1 | 11/2013 |

(Continued)

OTHER PUBLICATIONS

An Office Action mailed by the German Patent and Trademark Office dated Aug. 13, 2018, which corresponds to German Patent Application No. 112014006908.6 and is related to U.S. Appl. No. 15/324,011.

(Continued)

*Primary Examiner* — Phat X Cao
(74) *Attorney, Agent, or Firm* — Studebaker & Brackett PC

(57) ABSTRACT

An object of the present invention is to obtain a semiconductor device having highly reliable bonding portions. The semiconductor device according to the present invention includes an insulating substrate on which a conductive pattern is formed, and an electrode terminal and a semiconductor element which are bonded to the conductive pattern, the electrode terminal and the conductive pattern are bonded by ultrasonic bonding on a bonding face, and the ultrasonic bonding is performed at a plurality of positions.

1 Claim, 11 Drawing Sheets

(51) Int. Cl.
*H01L 23/00* (2006.01)
*H01L 23/498* (2006.01)
*H01L 25/07* (2006.01)
*H01L 25/18* (2006.01)
*H01L 23/24* (2006.01)
*H01L 23/373* (2006.01)

(52) U.S. Cl.
CPC .. *H01L 23/49517* (2013.01); *H01L 23/49558* (2013.01); *H01L 23/49811* (2013.01); *H01L 25/072* (2013.01); H01L 23/24 (2013.01); H01L 23/3735 (2013.01); H01L 24/29 (2013.01); H01L 24/32 (2013.01); H01L 24/45 (2013.01); H01L 24/48 (2013.01); H01L 24/73 (2013.01); H01L 24/83 (2013.01); H01L 25/18 (2013.01); H01L 2224/291 (2013.01); H01L 2224/29139 (2013.01); H01L 2224/32225 (2013.01); H01L 2224/32245 (2013.01); H01L 2224/45014 (2013.01); H01L 2224/45015 (2013.01); H01L 2224/45124 (2013.01); H01L 2224/45147 (2013.01); H01L 2224/45424 (2013.01); H01L 2224/48091 (2013.01); H01L 2224/48137 (2013.01); H01L 2224/73265 (2013.01); H01L 2224/8384 (2013.01); H01L 2924/1033 (2013.01); H01L 2924/10253 (2013.01); H01L 2924/10272 (2013.01); H01L 2924/12032 (2013.01); H01L 2924/13055 (2013.01); H01L 2924/13091 (2013.01); H01L 2924/181 (2013.01)

(56) References Cited

U.S. PATENT DOCUMENTS

| | | |
|---|---|---|
| 2007/0235860 A1 | 10/2007 | Steger et al. |
| 2008/0142571 A1* | 6/2008 | Yokozuka ............... H05K 1/144 |
| | | 228/110.1 |
| 2009/0206492 A1 | 8/2009 | Yamaguchi et al. |
| 2012/0106087 A1 | 5/2012 | Feller et al. |
| 2013/0069215 A1 | 3/2013 | Nakao et al. |
| 2013/0201741 A1 | 8/2013 | Tompkins et al. |

FOREIGN PATENT DOCUMENTS

| | | |
|---|---|---|
| EP | 1713124 A2 | 10/2006 |
| EP | 2498290 A1 | 9/2012 |
| EP | 2571053 A1 | 3/2013 |
| EP | 1931183 B1 | 11/2013 |
| JP | 2010-010537 A | 1/2010 |
| JP | 2012-146747 A | 8/2012 |
| JP | 2013-004658 A | 1/2013 |
| JP | 2013-235882 A | 11/2013 |
| WO | 2014/190968 A1 | 12/2014 |

OTHER PUBLICATIONS

Notification Concerning Transmittal of International Preliminary Report on Patentability and Translation of Written Opinion of the International Searching Authority; PCT/JP2014/072594; dated Mar. 9, 2017.

International Search Report issued in PCT/JP2014/072594; dated Nov. 25, 2014.

An Office Action; "Notification of Reasons for Refusal," issued by the Japanese Patent Office dated Nov. 14, 2017, which corresponds to Japanese Patent Application No. 2016-545167 and is related to U.S. Appl. No. 15/324,011; with English language translation.

An Office Action mailed by the State Intellectual Property Office of the People's Republic of China dated Mar. 19, 2019, which corresponds to Chinese Patent Application No. 201480081620.0 and is related to U.S. Appl. No. 16/237,311; with English translation.

\* cited by examiner

F I G . 1
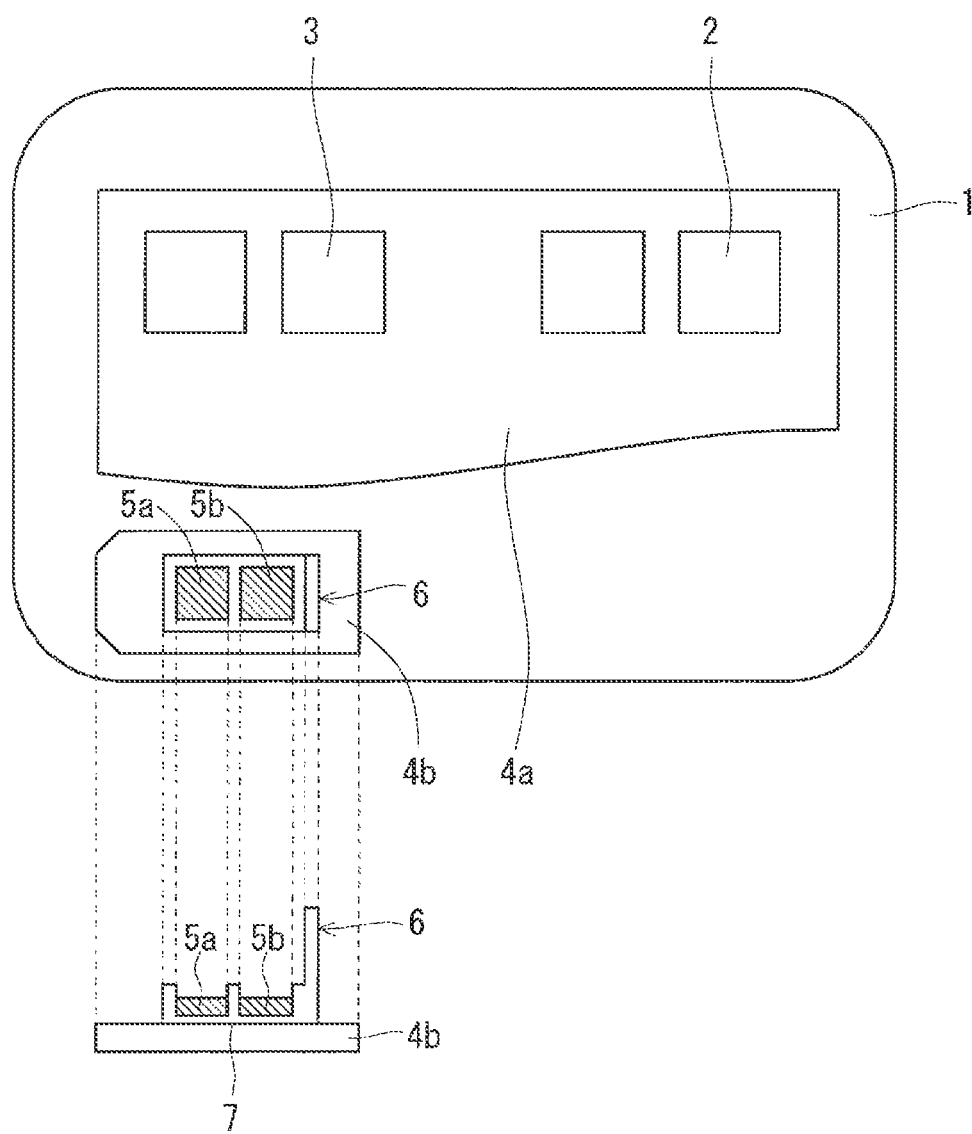

F I G. 9
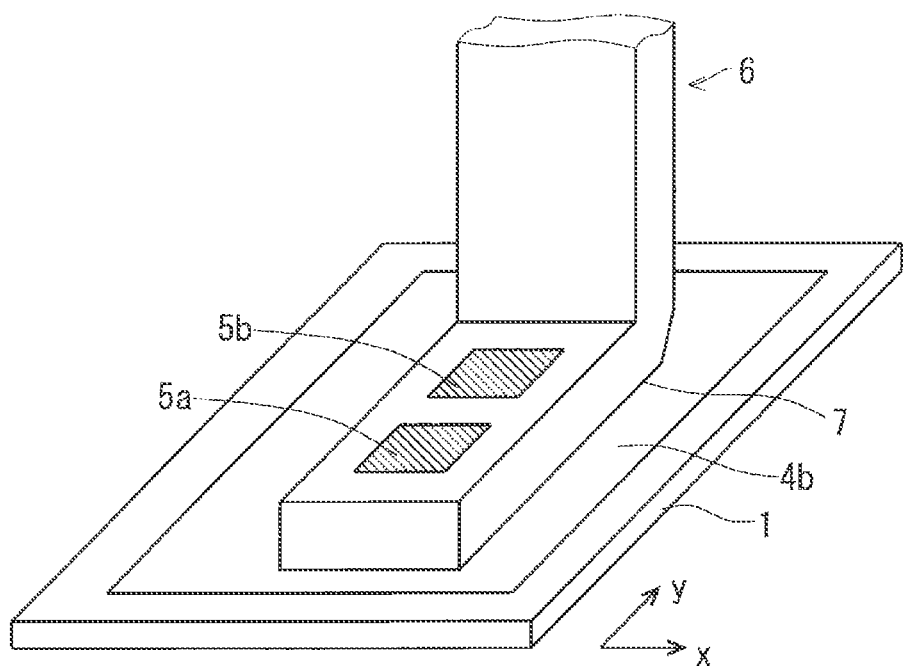
F I G. 10
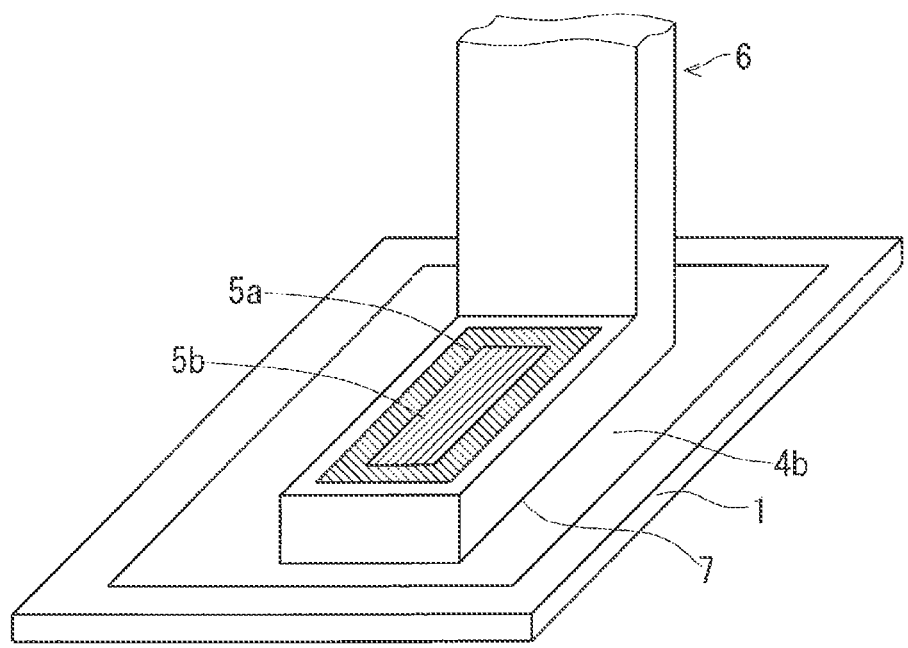

F I G . 1 1
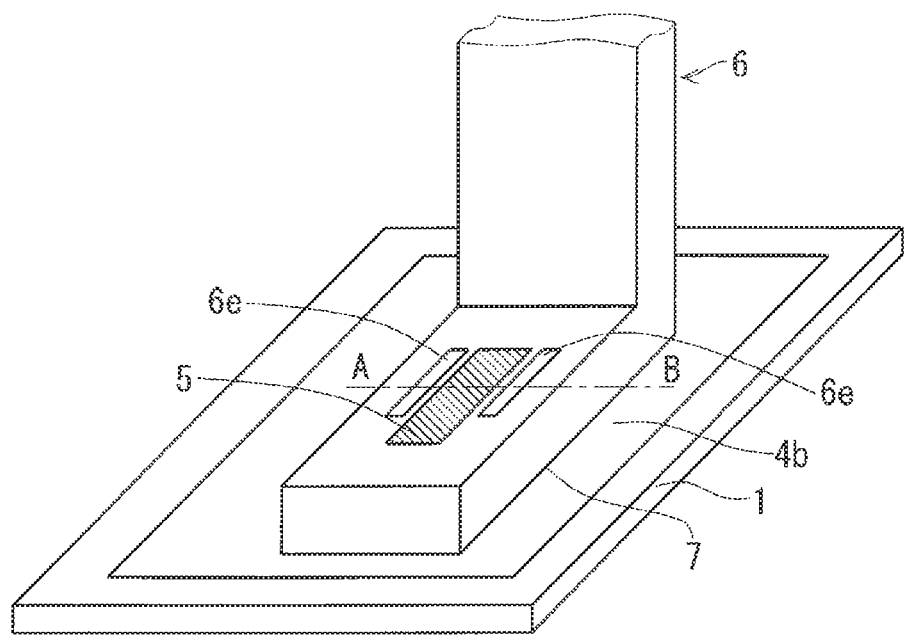
F I G . 1 2
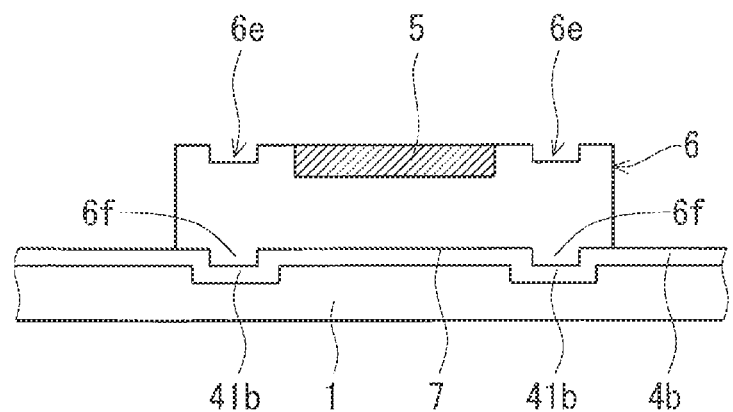

F I G. 1 3
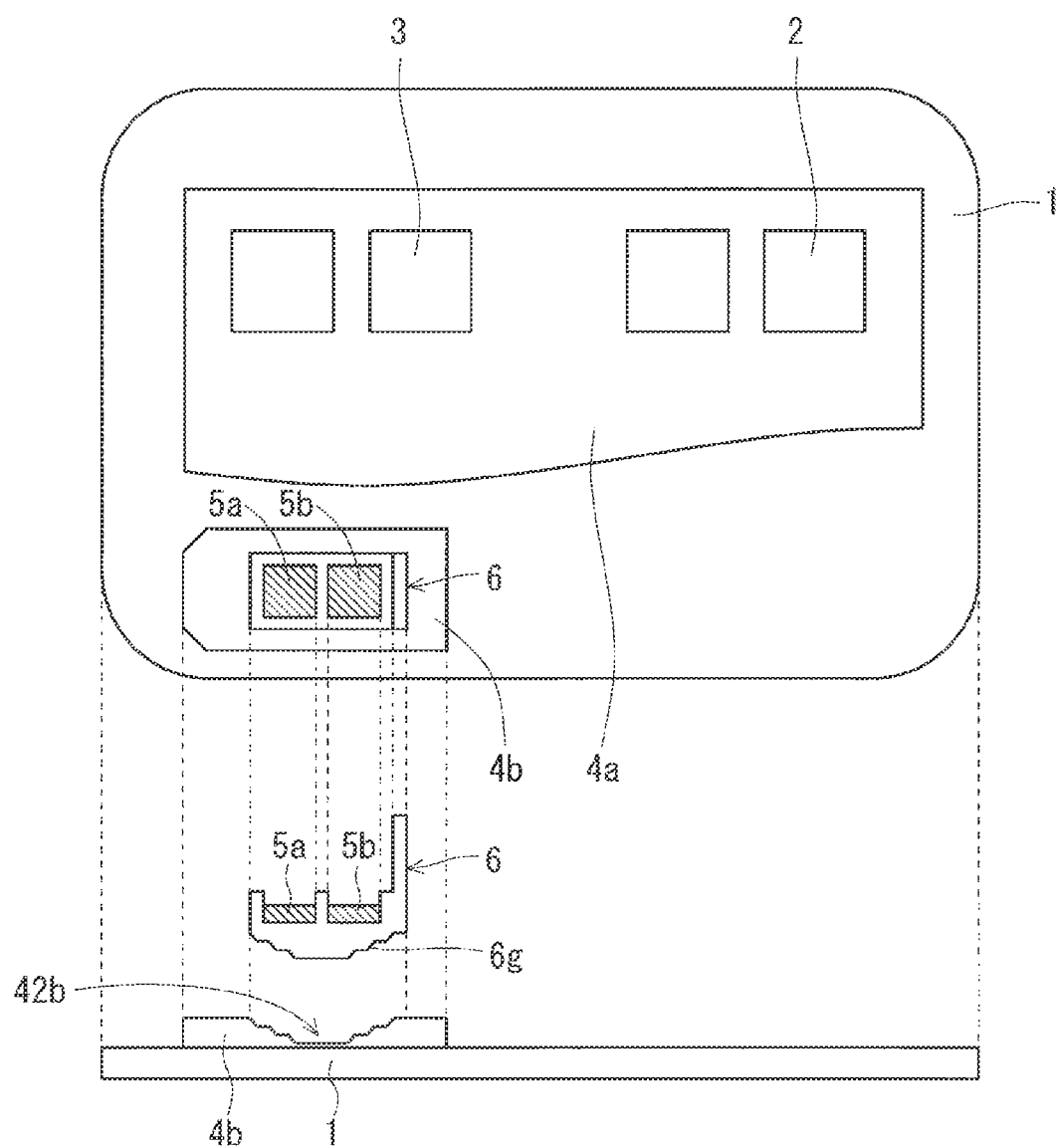

SEMICONDUCTOR DEVICE MANUFACTURING METHOD COMPRISING BONDING AN ELECTRODE TERMINAL TO A CONDUCTIVE PATTERN ON AN INSULATING SUBSTRATE USING ULTRASONIC BONDING

CROSS-REFERENCE TO RELATED APPLICATIONS

This application is a Continuation of U.S. patent application Ser. No. 15/324,011 filed Jan. 5, 2017, which is the U.S. National Phase Entry of International Patent Application No. PCT/JP2014/072594 filed Aug. 28, 2014, the entire contents of which are incorporated herein by reference.

TECHNICAL FIELD

The present invention relates to a semiconductor device, particularly to a semiconductor device to which an electrode terminal is bonded by ultrasonic bonding.

BACKGROUND ART

Nowadays, power semiconductor devices are necessary equipment in many different fields from small-sized electronic devices to automobiles, bullet trains, etc., and also to electric power transmission and distribution. The use areas and application fields have been increasing year by year, and in the fields of automobiles, bullet trains, electric power, and the like, higher current, higher breakdown voltage, and operation temperatures in a wide range, especially durability under high operation temperatures have been desired, not to mention high reliability and long lifetime. Since conventional solder-bonding techniques cannot ensure reliability of soldering materials under high temperatures, it is becoming more and more difficult to fabricate the elements that satisfy the conditions. As one of bonding techniques to solve this problem, the ultrasonic bonding has been introduced.

Here, a semiconductor device in which a conductive pattern is formed on a surface of an insulating substrate, and a semiconductor element and an electrode terminal are bonded to the conductive pattern is considered. Conventionally, the electrode terminal and the conductive pattern are subjected to the ultrasonic bonding at one position. When a power semiconductor element is used under conditions of high temperatures for a long period of time, a thermal stress is generated due to a difference in thermal expansion coefficients between the electrode terminal and the insulating substrate on which the conductive pattern is formed, and a bonding portion sometimes peels off.

In addition, as the semiconductor device carries larger current, it becomes necessary to increase a cross-sectional area of the electrode terminal. In other words, an increase in the thickness or the width of the electrode terminal requires an increase in the size of the electrode terminal. The increase in size of the electrode terminal causes an increase of the stiffness of the terminal. This results in an increase of a stress applied to the bonding portion accompanied by displacement of a package due to the heat generated by operation of the power semiconductor element, and thus a problem, such as reduction of bonding strength and terminal peeling, may occur.

Further, due to an increase in the thickness of the electrode terminal and the area of a bonding face, it becomes harder to propagate the energy of the ultrasonic bonding to the bonding face. To increase the bonding strength of the ultrasonic bonding, a bonding load and an ultrasonic output are generally increased as a countermeasure. However, the increase of these elements may cause a problem, i.e., the insulating substrate provided under the conductive pattern is damaged.

Accordingly, Patent Document 1 discloses a technique in which slits are provided at a plurality of positions between signal terminals that are subjected to the ultrasonic bonding, so that the ultrasonic bonding is stably performed. In addition, Patent Document 2 discloses a technique in which the ultrasonic bonding is performed at a plurality of positions between metal ribbons and electrode pads on a semiconductor chip to increase the area of the bonding face.

PRIOR ART DOCUMENTS

Patent Documents

Patent Document 1: Japanese Patent Application Laid-Open No. 2010-10537
Patent Document 2: Japanese Patent Application Laid-Open No. 2012-146747

SUMMARY OF INVENTION

Problems to be Solved by the Invention

However, the above conventional arts include the following problems to be solved. Although an initial bonding strength can be sufficiently obtained by the technique according to Patent Document 1, the bonding is susceptible to a thermal stress caused by heat from an electrode accompanied by use of a semiconductor module. As a bonding part of the electrode is divided by a slit and each of the parts is presumably bonded at one position, the plurality of bonding portions may all peel off due to generation of the stress.

According to Patent Document 2, an integral metal ribbon is bonded by ultrasonic bonding at a plurality of portions, but an unbonded portion between the bonded portions is floated from a target element and forms a gap. This is because a bonding target is a ribbon, which is thin in a thickness normally equal to or less than 300 μm, and the ribbon may split without a gap. The bonding target according to the present invention is an electrode having the thickness of 0.5 mm or more and hardly split, and thus it is not necessary to provide a gap.

The present invention has been made to solve the above problems, and an object is to obtain a semiconductor device having highly reliable bonding portions.

Means for Solving the Problems

The semiconductor device according to the present invention includes an insulating substrate on which a conductive pattern is formed, and an electrode terminal and a semiconductor element that are bonded to the conductive pattern, the electrode terminal and the conductive pattern are bonded together by the ultrasonic bonding through at least one bonding face, and the ultrasonic bonding is performed at a plurality of positions.

In addition, the semiconductor device according to the present invention includes an insulating substrate on which a conductive pattern is formed, and an electrode terminal and a semiconductor element that are bonded to the conductive pattern, the electrode terminal and the conductive pattern are bonded together by the ultrasonic bonding through at least one bonding face, the electrode terminal includes a projection and the conductive pattern includes a depression on the bonding face, alternatively the electrode terminal includes a depression and the conductive pattern includes a projection on the bonding face, and the projection and the depression are engaged with each other.

Effects of the Invention

In the semiconductor device according to the present invention, a plurality of ultrasonically bonding portions are provided on the bonding face. With this structure, an area of each bonding portion can be reduced. As a result, an absolute value of a thermal stress applied to each bonding portion can be reduced, and thus peeling of the bonding face can be suppressed. In addition, since the total area of the bonding portions increases, a reliable semiconductor device can be obtained.

Moreover, in the semiconductor device according to the present invention, the projection and the depression are fit with each other before performing the ultrasonic bonding, thereby facilitating positioning of the electrode terminal with respect to the conductive pattern. With this structure, at the time of performing the ultrasonic bonding, the relative position between the electrode terminal and the conductive pattern is settled, and the energy of the ultrasonic bonding can be sufficiently obtained. Since the ultrasonic bonding can be stably performed, a semiconductor device having a high bonding reliability can be obtained.

The object, features, aspects, and advantageous effects of the present invention are clarified by the following detailed description and the accompanied drawings.

BRIEF DESCRIPTION OF DRAWINGS

FIG. 1 is a plan view and a sectional view of a semiconductor device according to a first embodiment.

FIG. 9 is a perspective view of an electrode terminal and a conductive pattern of a semiconductor device according to a seventh embodiment.

FIG. 10 is a perspective view of an electrode terminal and a conductive pattern of a semiconductor device according to an eighth embodiment.

FIG. 11 is a perspective view of an electrode terminal and a conductive pattern of a semiconductor device according to a ninth embodiment.

FIG. 12 is a sectional view of the electrode terminal and the conductive pattern of the semiconductor device according to the ninth embodiment.

FIG. 13 a plan view and a sectional view of a semiconductor device according to a tenth embodiment.

DESCRIPTION OF EMBODIMENTS

Prerequisite Art

Figure 14:
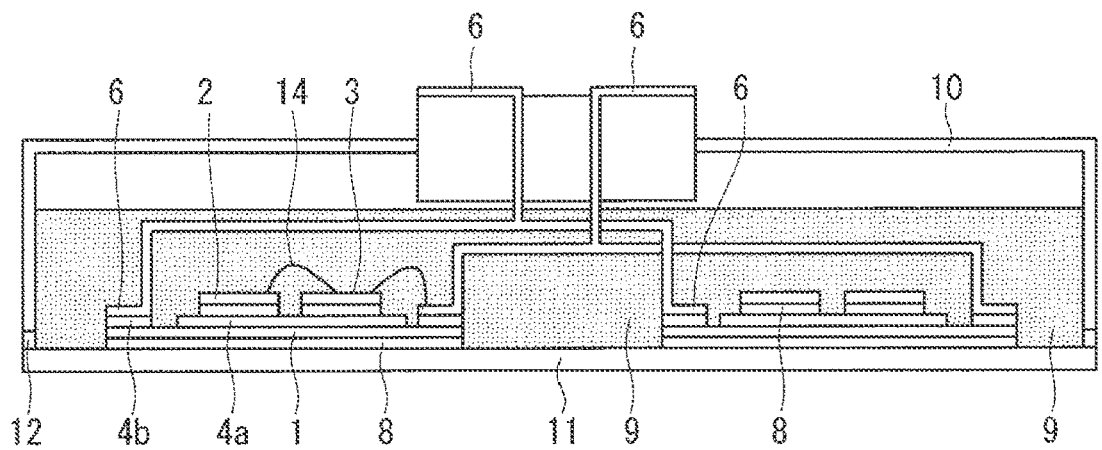
FIG. 14 is a sectional view of a semiconductor device according to a prerequisite art.

Before describing embodiments of the present invention, a prerequisite art for the present invention is described below. FIG. 14 is a sectional view of a semiconductor device (power module) according to the prerequisite art. The semiconductor device according to the prerequisite art includes an insulating substrate 1 or an insulating sheet, a Metal Oxide Semiconductor Field Effect Transistor (MOSFET) chip 2, a Shottkey Barrier Diode (SBD) chip 3, conductive patterns 4a, 4b, an electrode terminal 6, a wire 14, a sealing member 9, an outsert case 10, and a base plate 11.

The insulating substrate 1 is bonded to the base plate 11 for heat dissipation through a bonding member 8. The conductive patterns 4a, 4b formed from a conductive material are provided on the insulating substrate 1. The MOSFET chip 2 and the SBD chip 3 are mounted on the conductive pattern 4a with the bonding member.

The electrode terminal 6 is bonded to the conductive pattern 4b on the bonding face 7. The electrode of the MOSFET chip 2 and the electrode of the SBD chip 3 are bonded with each other by the wire 14. In addition, the electrode of the SBD chip 3 and the conductive pattern 4b are bonded with each other by the wire 14.

The outsert case 10 is attached to the base plate 11 by an adhesive agent 12. The outsert case 10 is filled with the insulating sealing member 9 formed of silicone gel, elastomer, or the like.

The conductive patterns 4a, 4b are formed by etching a copper plate brazed to the insulating substrate 1. The copper plate may be an aluminum plate. The surfaces of the conductive patterns 4a, 4b may be covered with nickel.

Although the insulating substrate 1 is formed by using an insulating material formed from AlN, the insulating material may also be $Al_2O_3$, $Si_3N_4$, or the like. Although the MOSFET chip 2 is mounted as a semiconductor element, the semiconductor element may also be an Insulated Gate Bipolar Transistor (IGBT). In addition, the SBD chips 3 may be a Free Wheel Diode (FWD). Note that the semiconductor element may be selected from elements having Si, SiC, or GaN as a base material. Although the wire 14 is an Al wire having 400 μm in diameter, the wire 14 may also be a wire formed from an Al alloy, a plate-shaped Al sheet, or a good conductive metal wire composed of Cu.

Although solder is generally used as the conductive bonding member 8, a sintered body of fine Ag particles having a diameter of about several nanometers may be used for coping with high-temperature operations. In addition, in the case of a semiconductor device handling a small current, a conductive adhesive agent containing a conductive filler may be used.

Although the insulating substrate 1 is bonded to the base plate 11 by the bonding member 8, the insulating substrate 1 may be formed integrally with the base plate 11. The material of the base plate 11 is a composite material formed from Al and ceramic, such as Al—SiC. In addition, the base plate 11 may also be a copper plate.

In FIG. 14, the bonding between the electrode terminal 6 and the conductive pattern 4b is performed by soldering. The solder bonding requires controlling of the maximum operation temperature and the melting point of solder, and has difficulty in coping with elevation of operation temperatures in the case where an SiC element, which is operable at high temperatures, is mounted as a semiconductor element.

Accordingly, in recent years, ultrasonic bonding has been applied to the bonding between the electrode terminal 6 and the conductive pattern 4b. The ultrasonic bonding is a technique in which ultrasonic vibration is applied to the bonding face of the materials that make contact with each other to generate frictional heat at a bonding portion, while imposing a load on the bonding face so that coupling metals are joined at the interface at an atomic level.

Figure 15:
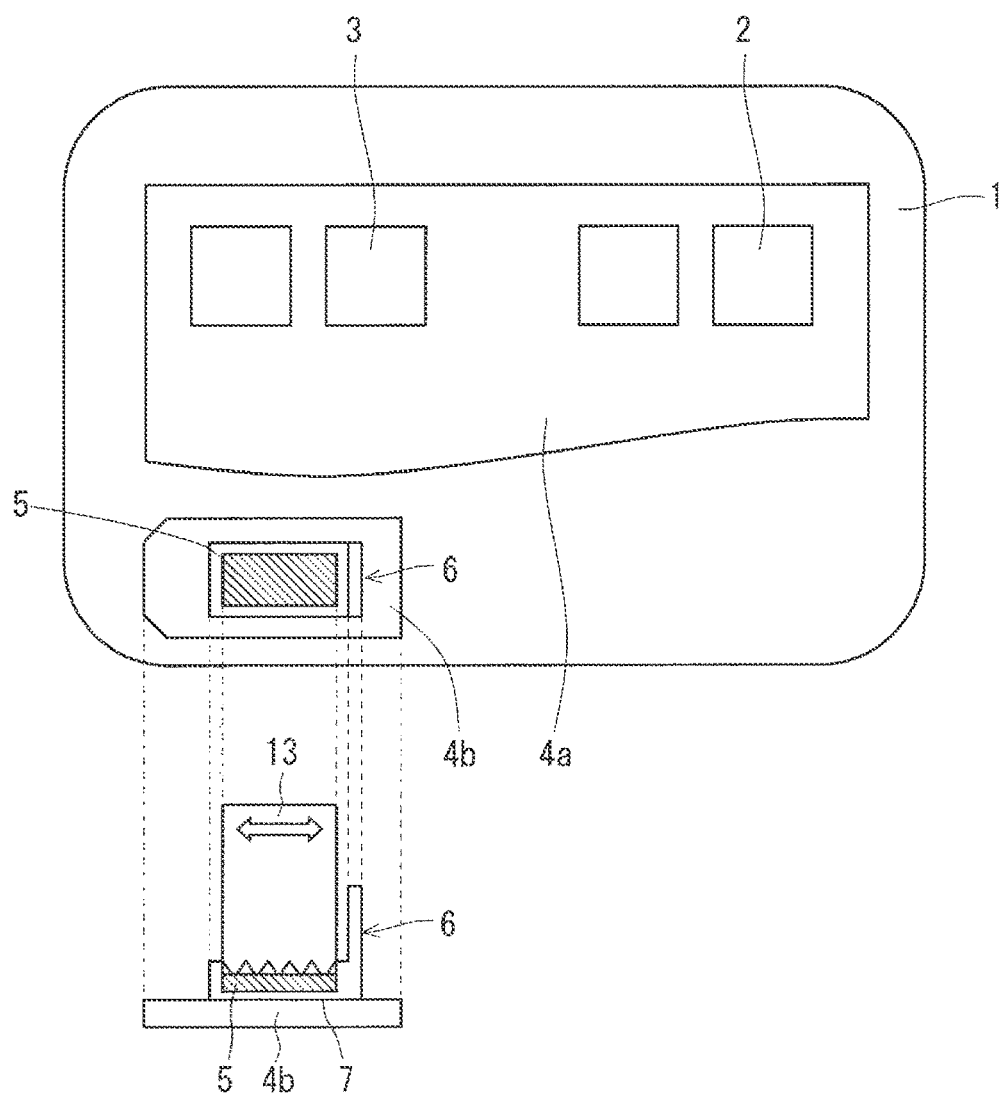
FIG. 15 is a plan view of the semiconductor device and a sectional view of an electrode terminal according to the prerequisite art.
Figure 16:
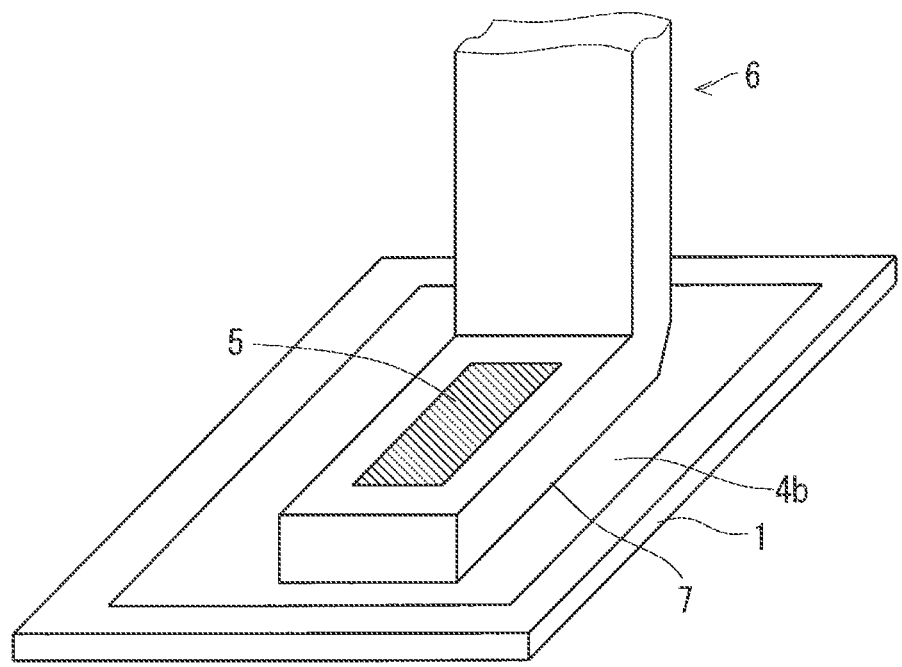
FIG. 16 is a perspective view of the electrode terminal and a conductive pattern of the semiconductor device according to the prerequisite art.

FIG. 15 is a view schematically showing the ultrasonic bonding. In addition, FIG. 16 is a perspective view of the bonding portion of the electrode terminal 6 and the conductive pattern 4b. As shown in FIG. 15, a tool 13 is pressed against an upper part of the bonding face 7 between the electrode terminal 6 and the conductive pattern 4b and is ultrasonically vibrated, for example in the direction of the arrow shown in the figure. The tool 13 transmits ultrasonic waves to the bonding face 7. At the time of the ultrasonic bonding, a recess 5 is formed on the upper surface of the electrode terminal 6 against which the tool 13 is pressed. Use of the ultrasonic bonding enables bonding in a short period of time without using a material such as an adhesive agent, solder, or the like. In addition, the use of the ultrasonic bonding also enables coping with high-temperature operations.

According to the prerequisite art, as shown in FIG. 16, the electrode terminal 6 and the conductive pattern 4b are bonded together by the ultrasonic bonding at one position. When a power semiconductor element is used under high-temperature conditions for a long period of time, the bonding portion sometimes peels off because of a thermal stress caused by a difference in thermal expansion coefficients between the electrode terminal 6 and the insulating substrate 1 on which the conductive pattern 4b is formed.

In addition, as the semiconductor device carries larger current, it becomes necessary to increase a cross-sectional area of the electrode terminal 6. In other words, an increase in the thickness or the width of the electrode terminal 6 requires an increase in the size of the electrode terminal 6. The increase in size of the electrode terminal 6 causes an increase of the stiffness of the terminal. This results in an increase of a stress applied to the bonding portion accompanied by displacement of a package due to the heat generated by operation of the power semiconductor element, and thus a problem, such as reduction of bonding strength and terminal peeling, may occur.

Further, due to an increase in the thickness of the electrode terminal and the area of a bonding face 7, it becomes harder to propagate the energy of the ultrasonic bonding to the bonding face 7. To increase the bonding strength of the ultrasonic bonding, a bonding load and an ultrasonic output are generally increased as a countermeasure. However, the increase of these elements may cause a problem, i.e., the insulating substrate 1 provided under the conductive pattern 4 is damaged.

First Embodiment

Structure

Figure 2:
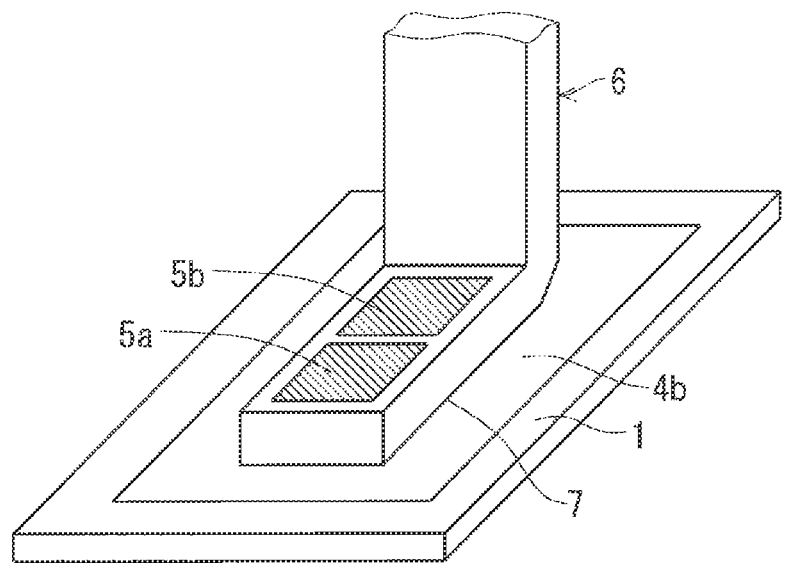
FIG. 2 is a perspective view of an electrode terminal and a conductive pattern of the semiconductor device according to the first embodiment.

FIG. 1 is a plan view and a front view of a structure of a semiconductor device according to a first embodiment. FIG. 2 is a perspective view of an electrode terminal 6 and a conductive pattern 4b. In this first embodiment, like in the prerequisite art (FIG. 14), conductive patterns 4a and 4b are disposed on the insulating substrate 1, and semiconductor elements (a MOSFET chip 2 and an SBD chip 3) are bonded to the conductive pattern 4a. The electrode terminal 6 is bonded on the conductive pattern 4b.

According to the prerequisite art, ultrasonic bonding is performed at only one position on one bonding face between the electrode terminal 6 and the conductive pattern 4b. Accordingly, a recess 5 is formed by the ultrasonic bonding at one position on the upper surface of a bonding portion of the electrode terminal 6.

On the other hand, according to this first embodiment, as shown in FIG. 1, a plurality of bonding portions are provided on one bonding face 7 of the electrode terminal 6 to which the conductive pattern 4b is bonded. Accordingly, a plurality of recesses 5a, 5b are formed by the ultrasonic bonding on the upper surface of the bonding portion of the electrode terminal 6. The bonding portions are spaced apart from each other. In other words, an interval of 50 μm or less is provided between the recesses 5a and 5b. Alternatively, the bonding portions may be in contact with each other.

Operation

In the semiconductor device configured as shown in FIG. 1, when a semiconductor element comes into operation, a current flows into the electrode terminal 6 and then the electrode terminal 6 generates heat. The generated heat causes the whole electrode terminal 6 to expand, a stress, such as tensile stress, is applied to the root of the electrode terminal 6 that is a bonding portion. In addition, the thermal stress is generated on the bonding face 7 between the electrode terminal 6 and the conductive pattern 4b because of a difference in thermal expansion coefficients between the materials of the insulating substrate 1 and the electrode terminal 6.

Effects

The semiconductor device according to this first embodiment includes an insulating substrate 1 on which conductive patterns 4a, 4b are formed, and an electrode terminal 6 and a semiconductor element that are bonded to the conductive patterns 4a, 4b, the electrode terminal 6 and the conductive pattern 4b are bonded together by the ultrasonic bonding through the bonding face 7, and the ultrasonic bonding is performed at a plurality of positions.

Accordingly, in this first embodiment, as shown in FIG. 1 and FIG. 2, a plurality of ultrasonically bonding portions are provided on the bonding face 7. With this structure, an area of each bonding portion can be reduced. As a result, an absolute value of a thermal stress applied to each bonding portion can be reduced, and thus peeling of the bonding face 7 can be suppressed. In addition, since the total area of the bonding portions increases, a highly reliable semiconductor device can be obtained.

In addition, the semiconductor device according to this first embodiment includes one bonding face 7, and the ultrasonic bonding is performed at a plurality of positions on the bonding face 7.

Accordingly, even with one bonding face 7, this first embodiment can provide a highly reliable semiconductor device by performing the ultrasonic bonding at two positions.

Second Embodiment

Structure

Figure 3:
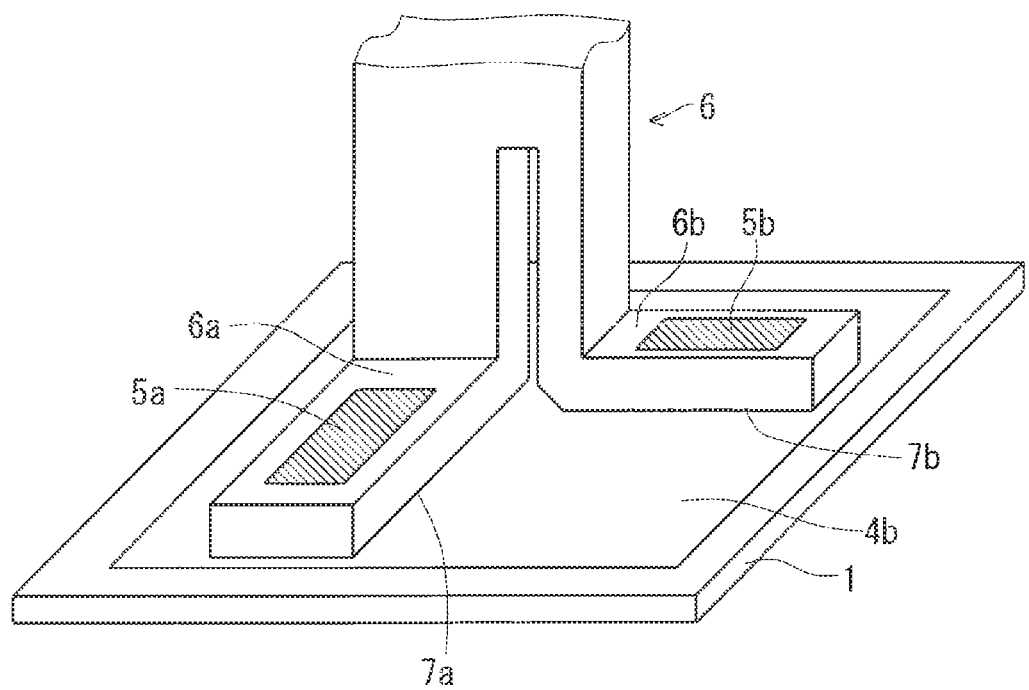
FIG. 3 is a perspective view of an electrode terminal and a conductive pattern of a semiconductor device according to a second embodiment.

FIG. 3 is a perspective view of an electrode terminal 6 and a conductive pattern 4b according to a second embodiment. In this second embodiment, the electrode terminal 6 is a flat plate. The root of the electrode terminal 6 is divided into two branches in the width direction. In other words, the root of the electrode terminal 6 includes two branches 6a, 6b.

As shown in FIG. 3, the branches 6a, 6b are bent to form an angle of 90° with each other in a plan view. The branch 6a is bonded to the conductive pattern 4b by ultrasonic bonding on the bonding face 7a. In the same manner, the branch 6b is bonded by the ultrasonic bonding to the conductive pattern 4b on the bonding face 7b. On the bonding faces 7a, 7b, the branches 6a, 6b are respectively bonded by the ultrasonic bonding to the conductive pattern 4b at one position. Recesses 5a, 5b are formed by the ultrasonic bonding at the upper surfaces of the branches 6a, 6b.

Operation

In this second embodiment, the sectional areas of the branches 6a and 6b of the electrode terminal 6 are assumed equal to each other. In this case, when the current flowing in one electrode terminal is defined as I [A], the current flowing in each of the branches 6a, 6b is I/2 [A].

In addition, the area of the bonding face of each of the branches 6a, 6b is half of that of the bonding face according to the first embodiment. Accordingly, with respect to the mechanical stress due to the expansion of the electrode terminal 6, the stress applied to the branches 6a, 6b is also reduced by half.

Effects

The semiconductor device according to this second embodiment includes a plurality of bonding faces 7a, 7b, the root of the electrode terminal 6 is divided into branches, and the divided root (i.e., branches 6a, 6b) forms the plurality of bonding faces 7a, 7b, and each of the bonding faces 7a, 7b includes at least one position that is subjected to the ultrasonic bonding.

In this second embodiment, the root of the electrode terminal 6 is divided into two branches, and the branches 6a, 6b form two bonding faces 7a, 7b, respectively. Each of the bonding faces 7a, 7b includes one position that is subjected to the ultrasonic bonding. Accordingly, in this second embodiment, by dividing the root of the electrode terminal 6 into two branches, the current flowing in each terminal (branches 6a, 6b) becomes I/2 [A], and thus the heating value of each of the bonding faces is reduced by half as compared to that of the first embodiment. This enables the thermal stress applied to each bonding face to be reduced by half.

In addition, since two bonding faces 7a, 7b are provided, peeling of the bonding faces 7a, 7b can be suppressed as compared to a case where one bonding face 7 is provided as in the prerequisite art, even when a force to peel the electrode terminal 6 upward (stress generated perpendicular to the bonding face) is generated. Accordingly, a semiconductor device having highly reliable bonding portions can be obtained.

In addition, in the semiconductor device according to this second embodiment, the electrode terminal 6 is a flat plate, the root of the electrode terminal 6 is divided in the thickness direction or in the width direction.

According to the present embodiment, the root of the electrode terminal 6 in the shape of a flat plate is divided into two branches in the width direction. Accordingly, in fabrication of the electrode terminal 6, the root of the electrode terminal 6 can be divided into two branches by a press processing. Accordingly, a semiconductor device which is easily processed and reduced in cost can be obtained.

In addition, in the semiconductor device according to this second embodiment, the root of the electrode terminal 6 is divided into two, three, or four branches.

According to the present embodiment, the root of the electrode terminal 6 is divided into two branches. Accordingly, in this second embodiment, by dividing the root of the electrode terminal 6 into two branches, the current flowing in each terminal (branches 6c, 6d) is reduced by half, and thus the heating value of each of the bonding faces is reduced by half as compared to that of the first embodiment. This enables the thermal stress applied to each bonding face to be reduced by half.

In addition, in the semiconductor device according to this second embodiment, the branch parts at the root of the electrode terminal 6 are separated from each other toward the bonding faces 7a, 7b in a plan view.

In the semiconductor device according to this second embodiment, the branches 6a, 6b form an angle of 90° with each other in a plan view. Accordingly, peeling of the bonding faces 7a, 7b can be suppressed as compared to a case where the bonding face is provided only in one direction of the electrode terminal 6, even when a force to peel the electrode terminal 6 upward (stress generated perpendicular to the bonding face) is generated. Accordingly, a semiconductor device having highly reliable bonding portions can be obtained.

Third Embodiment

Structure

Figure 4:
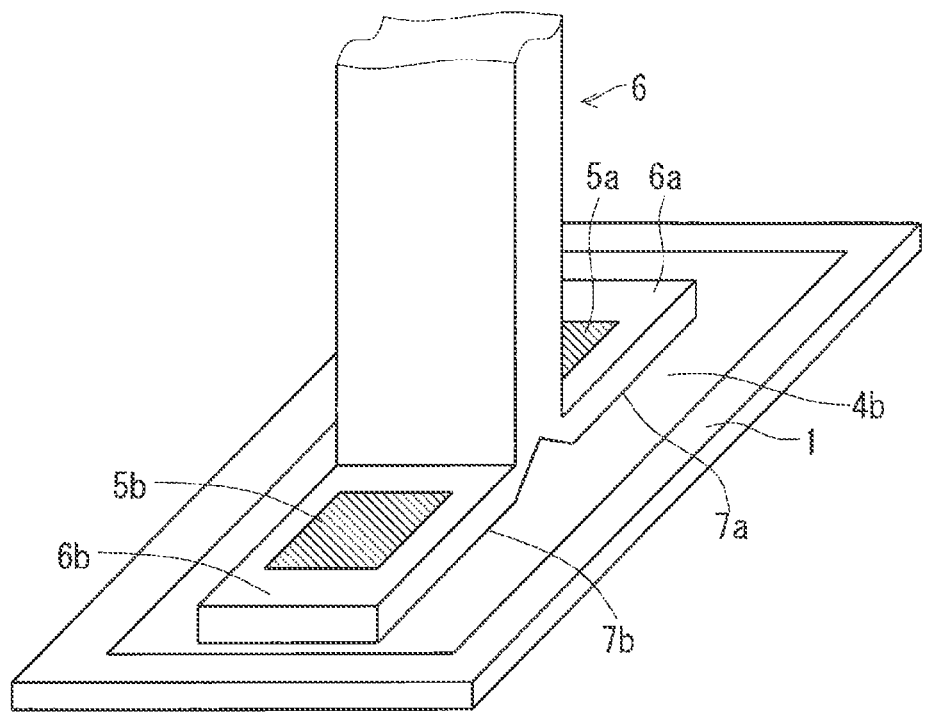
FIG. 4 is a perspective view of an electrode terminal and a conductive pattern of a semiconductor device according to a third embodiment.

FIG. 4 is a perspective view of an electrode terminal 6 and a conductive pattern 4b according to a third embodiment. In this third embodiment, the electrode terminal 6 is a flat plate. The root of the electrode terminal 6 is divided into two branches in the thickness direction. In other words, the root of the electrode terminal 6 includes two branches 6a, 6b.

As shown in FIG. 4, the branches 6a, 6b are bent in opposite directions to form an angle of 180° with each other in a plan view. The branch 6a is bonded to the conductive pattern 4b by ultrasonic bonding on the bonding face 7a. Similarly, the branch 6b is bonded by the ultrasonic bonding to the conductive pattern 4b on the bonding face 7b. Each of the branches 6a, 6b is bonded by the ultrasonic bonding to the conductive pattern 4b at one position on one of the bonding faces 7a, 7b. The total sum of the areas of the bonding faces 7a, 7b according to this third embodiment is twice as large as that of the bonding face 7 according to the prerequisite art. The recesses 5a, 5b are formed by the ultrasonic bonding on the upper surfaces of the branches 6a, 6b, respectively. In this third embodiment, when the thickness of the electrode terminal 6 is defined as w6, the thickness of the branch 6a is defined as w6a, and the thickness of the branch 6b is defined as w6b, w6=w6a+w6b and w6a=w6b are satisfied. Note that w6a and w6b may be arbitrary values on condition that the thicknesses satisfy the relation, w6=w6a+w6b.

Operation

In this third embodiment, the sectional areas of the branches 6a and 6b of the electrode terminal 6 are assumed equal to each other. In this case, when the current flowing in one electrode terminal is defined as I [A], the current flowing in each of the branches 6c, 6d is I/2 [A]. At the bonding faces 7a, 7b, the thicknesses of the branches 6a, 6b that are subjected to bonding are less than those in the second embodiment. With this structure, the stress applied to the branches 6a, 6b is reduced by half with respect to the mechanical stress due to the expansion of the electrode terminal 6.

Effects

In the semiconductor device according to this third embodiment, the electrode terminal 6 is a flat plate, and the root of the electrode terminal 6 is divided in the thickness direction or in the width direction.

In this third embodiment, the root of the electrode terminal 6 in the shape of a flat plate is divided into two branches in the thickness direction. Accordingly, since the thickness of the electrode terminal 6 is reduced at the bonding portions, the electrode is deformed largely due to the stress, and thus the stress applied to the bonding portions can be reduced and a semiconductor device having highly reliable bonding portions can be obtained.

In addition, in the semiconductor device according to this third embodiment, the root of the electrode terminal 6 is divided into two, three, or four branches.

According to this third embodiment, the root of the electrode terminal 6 is divided into two branches. Accordingly, in this third embodiment, by dividing the root of the electrode terminal 6 into two branches, the current flowing in each terminal (branches 6c, 6d) is reduced by half, and thus the heating value of each of the bonding faces is reduced by half as compared to that of the first embodiment. This enables the thermal stress applied to each bonding face to be reduced by half.

In addition, since two bonding faces 7a, 7b are provided by dividing the root of the electrode terminal 6 into two branches, peeling of the bonding faces 7a, 7b can be suppressed as compared to a case where one bonding face 7 is provided as in the prerequisite art, even when a force to peel the electrode terminal 6 upward (stress generated perpendicular to the bonding face) is generated. Accordingly, a semiconductor device having highly reliable bonding portions can be obtained.

In addition, in the semiconductor device according to this third embodiment, the branch parts at the root of the electrode terminal 6 are angled such that the branch parts go away from each other in a plan view with respect to the bonding faces 7a, 7b.

In the semiconductor device according to this third embodiment, the branches 6a, 6b form an angle of 180° with each other in a plan view. Accordingly, peeling of the bonding faces 7a, 7b can be suppressed as compared to a case where the bonding face is provided only in one direction of the electrode terminal 6, even when a force to peel the electrode terminal 6 upward (stress generated perpendicular to the bonding face) is generated. Accordingly, a semiconductor device having highly reliable bonding portions can be obtained.

Fourth Embodiment

Structure

Figure 5:
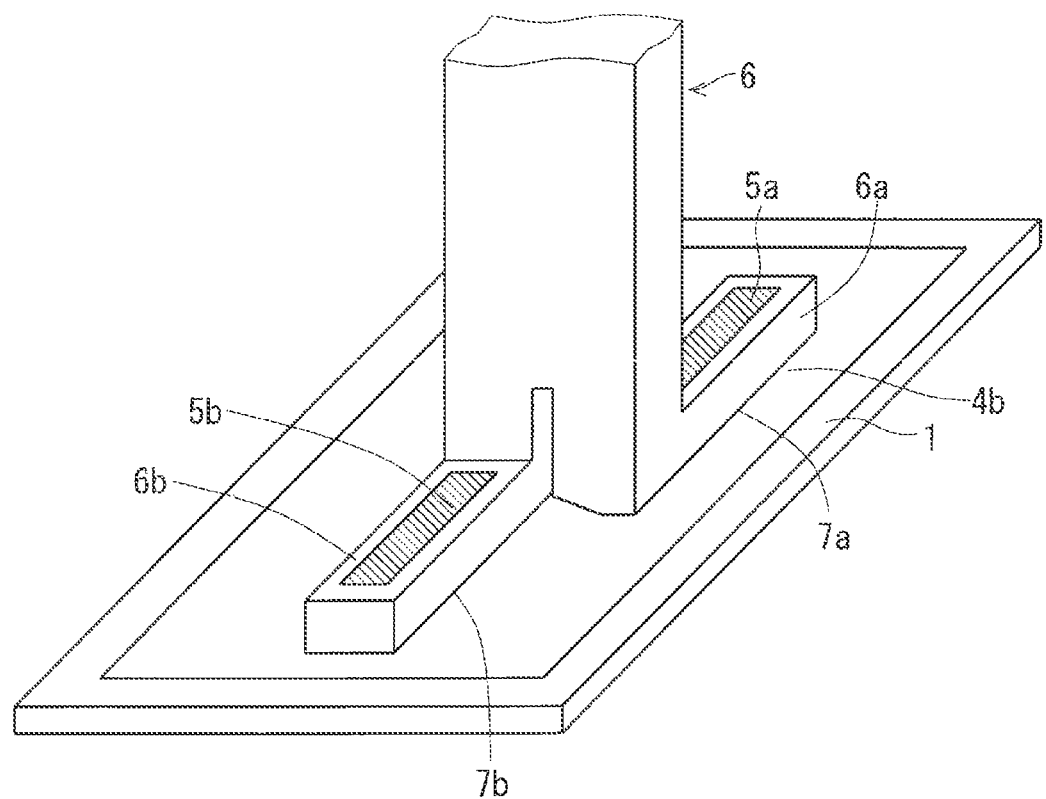
FIG. 5 is a perspective view of an electrode terminal and a conductive pattern of a semiconductor device according to a fourth embodiment.

FIG. 5 is a perspective view of an electrode terminal 6 and a conductive pattern 4b according to a fourth embodiment. In this fourth embodiment, the electrode terminal 6 is a flat plate. The root of the electrode terminal 6 is divided into two branches in the width direction. In other words, the root of the electrode terminal 6 includes two branches 6a, 6b.

As shown in FIG. 5, the branches 6a, 6b are bent in opposite directions to form an angle of 180° with each other in a plan view. The branch 6a is bonded to the conductive pattern 4b by ultrasonic bonding on the bonding face 7a. Similarly, the branch 6b is bonded by the ultrasonic bonding to the conductive pattern 4b on the bonding face 7b. Each of the branches 6a, 6b is bonded by the ultrasonic bonding to the conductive pattern 4b at one position on one of the bonding faces 7a, 7b. The recesses 5a, 5b are formed by the ultrasonic bonding on the upper surfaces of the branches 6a, 6b, respectively.

Effects

In addition, in the semiconductor device according to this fourth embodiment, the electrode terminal 6 is a flat plate, and the root of the electrode terminal 6 is divided in the thickness direction or in the width direction.

According to this fourth embodiment, the root of the electrode terminal 6 in the shape of a flat plate is divided into two branches in the width direction. Accordingly, in fabrication of the electrode terminal 6, the root of the electrode terminal 6 can be divided into two branches by a press processing. Accordingly, a semiconductor device which is easily processed and reduced in cost can be obtained.

In addition, in the semiconductor device according to this fourth embodiment, the root of the electrode terminal 6 is divided into two, three, or four branches.

According to this fourth embodiment, the root of the electrode terminal 6 is divided into two branches. Accordingly, in this fourth embodiment, by dividing the root of the electrode terminal 6 into two branches, the current flowing in each terminal (branches 6c, 6d) is reduced by half, and thus the heating value of each of the bonding faces is reduced by half as compared to that of the first embodiment. This enables the thermal stress applied to each bonding face to be reduced by half.

In addition, since two bonding faces 7a, 7b are provided by dividing the root of the electrode terminal 6 into two branches, peeling of the bonding faces 7a, 7b can be suppressed as compared to a case where one bonding face 7 is provided as in the prerequisite art, even when a force to peel the electrode terminal 6 upward (stress generated perpendicular to the bonding face) is generated. Accordingly, a semiconductor device having highly reliable bonding portions can be obtained.

In addition, in the semiconductor device according to this fourth embodiment, the branch parts at the root of the electrode terminal 6 are angled such that the branch parts go away from each other in a plan view with respect to the bonding faces 7a, 7b.

In the semiconductor device according to this fourth embodiment, the branches 6a, 6b form an angle of 180° with each other in a plan view. Accordingly, peeling of the bonding faces 7a, 7b can be suppressed as compared to a case where the bonding face is provided only in one direction of the electrode terminal 6, even when a force to peel the electrode terminal 6 upward (stress generated perpendicular to the bonding face) is generated. Accordingly, a semiconductor device having highly reliable bonding portions can be obtained.

Fifth Embodiment

Structure

Figure 6:
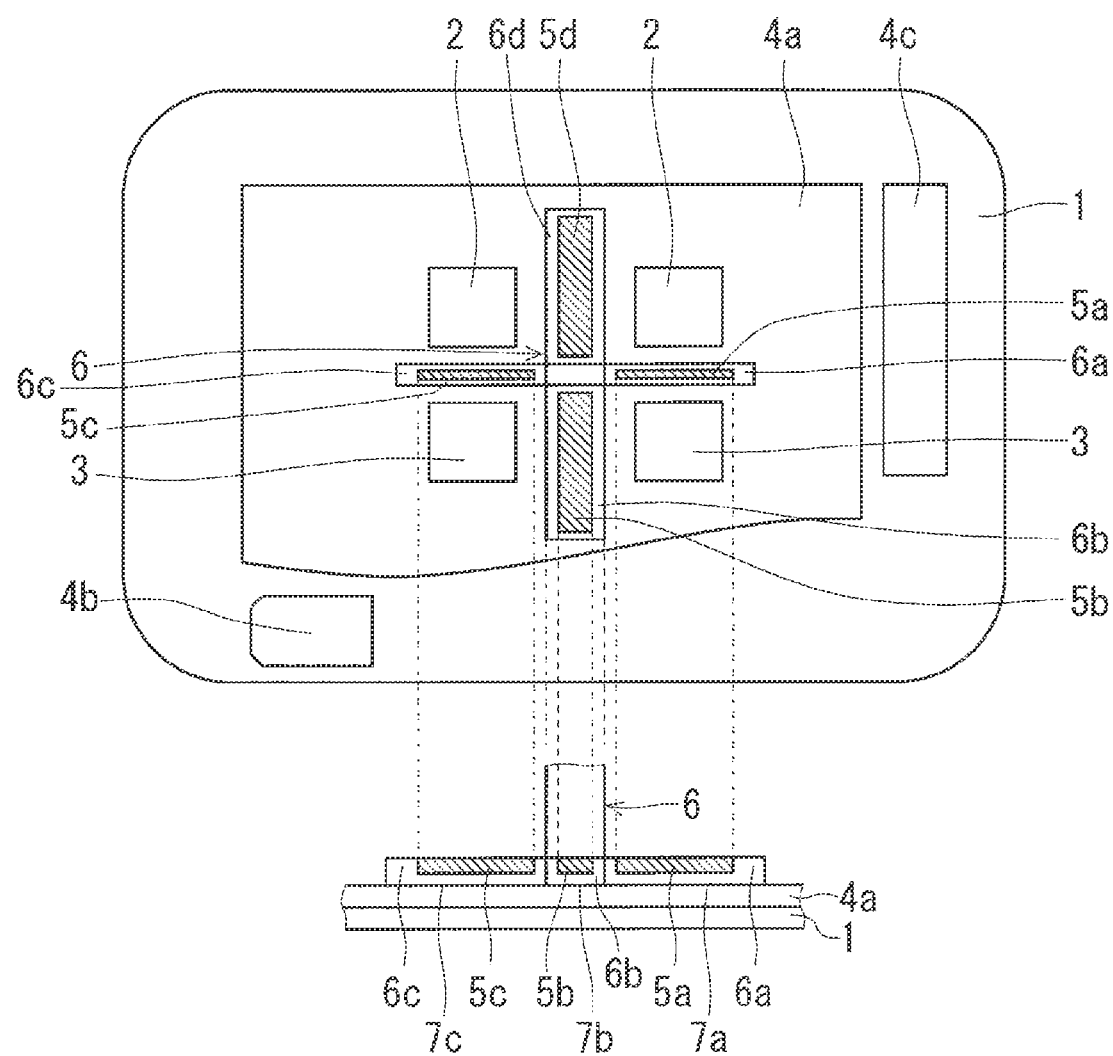
FIG. 6 is a plan view and a sectional view of a semiconductor device according to a fifth embodiment.
Figure 7:
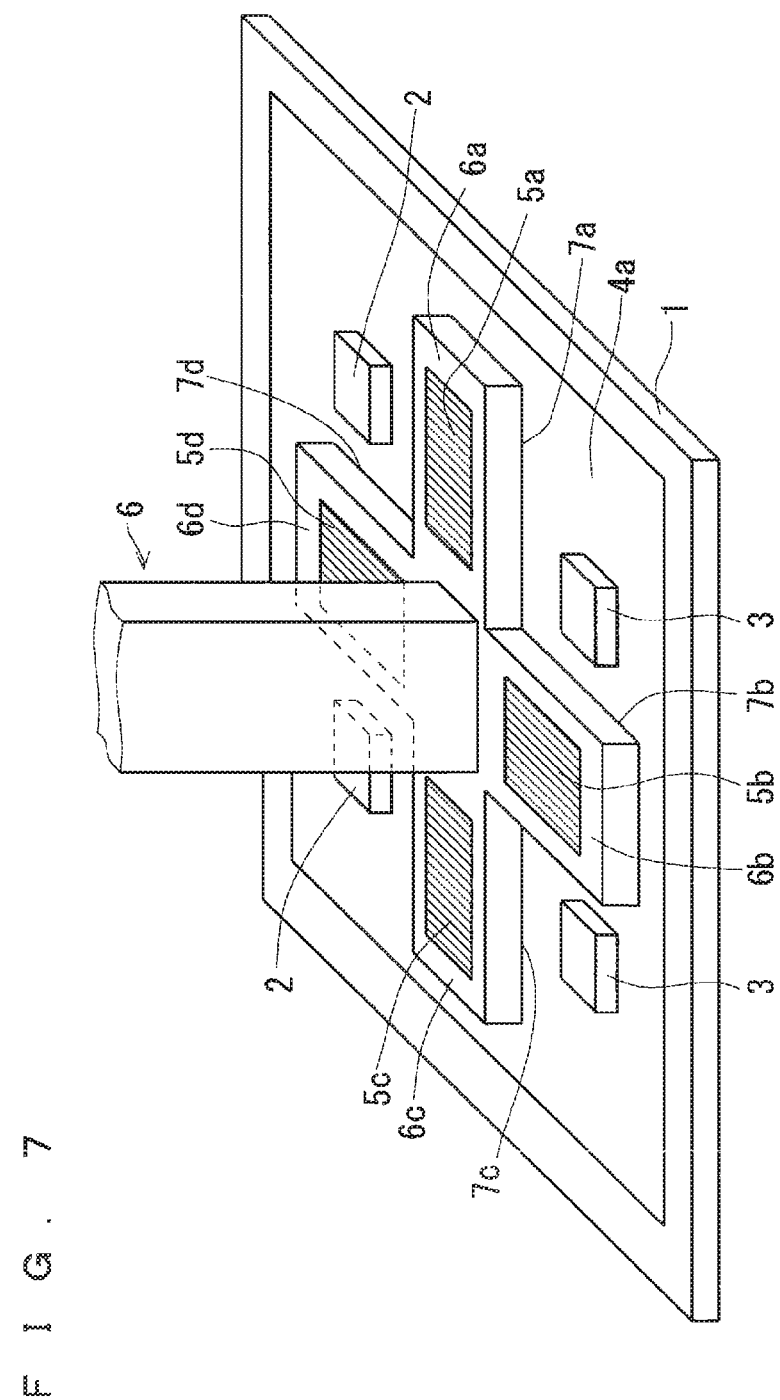
FIG. 7 is a perspective view of an electrode terminal and a conductive pattern of the semiconductor device according to the fifth embodiment.

FIG. 6 is a plan view and a front view of a structure of a semiconductor device according to a fifth embodiment. FIG. 7 is a perspective view of an electrode terminal 6 and a conductive pattern 4b. Note that in FIG. 7, semiconductor elements (an MOSFET chip 2, an SBD chip 3) are omitted for easy understanding. As shown in FIG. 6, a plurality of conductive patterns 4a, 4b, 4c are formed on the insulating substrate 1.

In this fifth embodiment, the electrode terminal 6 is a flat plate. The root of the electrode terminal 6 is divided into four branches. In other words, the root of the electrode terminal 6 includes four branches 6a, 6b, 6c, 6d. As shown in FIG. 7, opposing branches 6a, 6c are bent in directions that are opposite to each other. Similarly, opposing branches 6b, 6d are bent in directions that are opposite to each other. In other words, the branch 6a and the branch 6b, the branch 6b and the branch 6c, the branch 6c and the branch 6d, and the branch 6d and the branch 6a respectively form an angle of 90° with each other in a plan view.

The branches 6a, 6b, 6c, 6d are bonded to the conductive pattern 4a by ultrasonic bonding on the bonding faces 7a, 7b, 7c, 7d, respectively. Each of the branches 6a, 6b, 6c, 6d is bonded by the ultrasonic bonding to the conductive pattern 4a at one position on one of the bonding faces 7a, 7b, 7c, 7d. The recesses 5a, 5b, 5c, 5d are formed by the ultrasonic bonding on the upper surfaces of the branches 6a, 6b, 6c, 6d, respectively.

As shown in FIG. 6, an SBD chip 3 is bonded to the conductive pattern 4a at a position next to the branch 6a and the branch 6b. In addition, an SBD chip 3 is bonded to the conductive pattern 4a at a position next to the branch 6b and the branch 6c. In addition, an MOSFET chip 2 is bonded to the conductive pattern 4a at a position next to the branch 6c and the branch 6d. An MOSFET chip 2 is bonded to the conductive pattern 4a at a position next to the branch 6d and the branch 6a.

Operation

In the semiconductor device configured as shown in FIG. 6 and FIG. 7, when a semiconductor element comes into operation, a current flows into the electrode terminal 6 and then the electrode terminal 6 generates heat. In the case where there is a difference between the distances from each of the branches 6a, 6b, 6c, 6d to the MOSFET chips 2 and the SBD chips 3 when a power semiconductor element is in operation, the wiring resistance is varied depending on the distance, and thus the amounts of the current flow become unequal. This causes a deviation in the heating positions. Since the heat makes the whole electrode terminal 6 expand, a stress such as a tensile stress is applied to the root of the electrode terminal 6, which is a bonding portion, and thus a difference in the amount of the heating value generates a difference in the stress applied to the branches 6a to 6d.

According to this fifth embodiment, the branches 6a to 6d are disposed to extend in four directions, and the MOSFET chips 2 and the SBD chips 3 are disposed next to the branches, and thus a difference between the distances from each of the branches 6a, 6b, 6c, 6d to the MOSFET chips 2 and the SBD chips 3 can be reduced. With this structure, a deviation in the temperature rise caused by an uneven current flow can be reduced, and thus the heat cycle property is improved.

In addition, since the bonding faces 7a to 7d are provided in four directions of the electrode terminal 6, peeling of the bonding faces 7a to 7d can be suppressed as compared to a case where one bonding face 7 is provided as in the prerequisite art, even when a force to peel the electrode terminal 6 upward (stress generated perpendicular to the bonding face) is generated. Accordingly, a semiconductor device having highly reliable bonding portions can be obtained, and thus the heat cycle property is improved.

Effects

In the semiconductor device according to this fifth embodiment, the root of the electrode terminal 6 is divided into two, three, or four branches.

According to this fifth embodiment, the root of the electrode terminal 6 are divided into four branches, and the branches 6a to 6d are disposed to extend in four directions. The MOSFET chips 2 and the SBD chips 3 are disposed next to the branches, and thus a difference between the distances from each of the branches 6a, 6b, 6c, 6d to the MOSFET chips 2 and the SBD chips 3 can be reduced. With this structure, a deviation in the temperature rise caused by an uneven current flow can be reduced.

In addition, in the semiconductor device according to this fifth embodiment, the branch parts at the root of the electrode terminal 6 are angled such that the branch parts go away from each other in a plan view with respect to the bonding faces 7a, 7b.

In the semiconductor device according to this fifth embodiment, the branches 6a, 6b, 6c, 6d form an angle of 90° with each other in a plan view. Accordingly, peeling of the bonding faces 7a, 7b, 7c, 7d can be suppressed as compared to a case where the bonding face is provided only in one direction of the electrode terminal 6, even when a force to peel the electrode terminal 6 upward (stress generated perpendicular to the bonding face) is generated. Accordingly, a semiconductor device having highly reliable bonding portions can be obtained.

Sixth Embodiment

Structure

Figure 8:
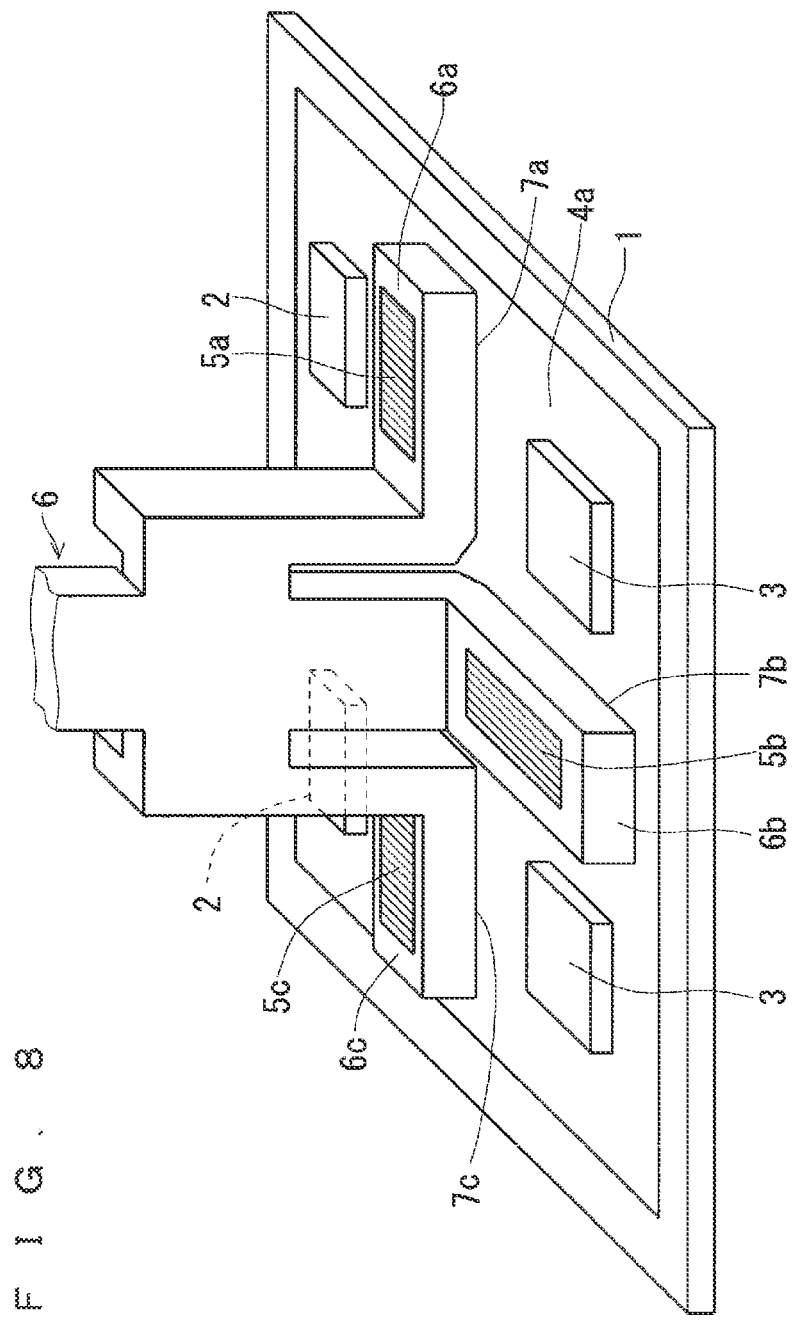
FIG. 8 is a perspective view of an electrode terminal and a conductive pattern of a semiconductor device according to a sixth embodiment.

FIG. 8 is a perspective view of an electrode terminal 6 and a conductive pattern 4b of a semiconductor device according to a sixth embodiment. The semiconductor device may include the electrode terminal 6 according to this sixth embodiment instead of the electrode terminal 6 according to the fifth embodiment (FIG. 7).

The electrode terminal 6 according to this sixth embodiment is a flat plate, and the root thereof is divided into three branches. In other words, the root of the electrode terminal 6 includes three branches 6a, 6b, 6c. As shown in FIG. 8, the branch 6a and the branch 6b, and the branch 6b and the branch 6c are bent to form an angle of 90° with each other in a plan view.

The branches 6a, 6b, 6c are bonded to the conductive pattern 4a by ultrasonic bonding on the bonding faces 7a, 7b, 7c, respectively. Each of the branches 6a, 6b, 6c is bonded by the ultrasonic bonding to the conductive pattern 4a at one position on one of the bonding faces 7a, 7b, 7c. The recesses 5a, 5b, 5c are formed by the ultrasonic bonding on the upper surfaces of the branches 6a, 6b, 6c, respectively.

As shown in FIG. 8, an SBD chip 3 is bonded to the conductive pattern 4a at a position next to the branch 6a and the branch 6b. In addition, an SBD chip 3 is bonded to the conductive pattern 4a at a position next to the branch 6b and the branch 6c. In addition, an MOSFET chip 2 is bonded to the conductive pattern 4a at a position opposite to the SBD chip 3 across the branch 6a. In addition, an MOSFET chip 2 is bonded to the conductive pattern 4a at a position opposite to the SBD chip 3 across the branch 6c.

Note that although each of the branch 6a and the branch 6b, the branch 6b and the branch 6c are bent to form an angle of 90° with each other in a plan view, they may be bent to form an arbitrary angle, for example an angle of 120°.

Effects

In the semiconductor device according to this sixth embodiment, the root of the electrode terminal 6 is divided into two, three, or four branches.

According to this sixth embodiment, the root of the electrode terminal 6 is divided into three branches, and the branches 6a to 6c are disposed to extend in three directions. The MOSFET chips 2 and the SBD chips 3 are disposed next to the branches, and thus a difference between the distances from each of the branches 6a, 6b, 6c to the MOSFET chips 2 and the SBD chips 3 can be reduced. With this structure, a deviation in the temperature rise caused by an uneven current flow can be reduced, and thus the heat cycle property is improved.

In addition, since the bonding faces 7a to 7c are provided in three directions of the electrode terminal 6, peeling of the bonding faces 7a to 7c can be suppressed as compared to a case where one bonding face 7 is provided as in the prerequisite art, even when a force to peel the electrode terminal 6 upward (stress generated perpendicular to the bonding face) is generated. Accordingly, a semiconductor device having highly reliable bonding portions can be obtained.

In addition, in fabrication of the electrode terminal 6, the root of the electrode terminal 6 can be divided into three branches by a press processing. Accordingly, a semiconductor device which is easily processed and reduced in cost can be obtained.

In addition, in the semiconductor device according to this sixth embodiment, the branch parts at the root of the electrode terminal 6 are angled such that the branch parts go away from each other in a plan view with respect to the bonding faces 7a, 7b, 7c.

In the semiconductor device according to this sixth embodiment, the branches 6a, 6b, 6c form an angle of 90° with each other in a plan view. Accordingly, peeling of the bonding faces 7a, 7b, 7c can be suppressed as compared to a case where the bonding face is provided only in one direction of the electrode terminal 6, even when a force to peel the electrode terminal 6 upward (stress generated perpendicular to the bonding face) is generated. Accordingly, a semiconductor device having highly reliable bonding portions can be obtained.

Seventh Embodiment

Structure

FIG. 9 is a perspective view of an electrode terminal 6 and a conductive pattern 4b of a semiconductor device according to a seventh embodiment. In the semiconductor device according to this seventh embodiment, the electrode terminal 6 is bonded to the conductive pattern 4b by ultrasonic bonding on one bonding face 7 in the same manner as the first embodiment (FIG. 1 and FIG. 2). This bonding face 7 includes two bonding portions. In other words, two recesses 5a, 5b are generated on the upper surfaces of the roots of the electrode terminal 6 at the time of the ultrasonic bonding.

In FIG. 9, the recess 5a is formed at the time of the ultrasonic bonding in which a tool (see tool 13 in FIG. 14) is vibrated in the x-direction. In addition, the recess 5b is formed at the time of the ultrasonic bonding in which the tool is vibrated in the y-direction. In other words, a plurality of positions subjected to the ultrasonic bonding on the bonding face 7 are vibrated in directions different from each other at the time of the ultrasonic bonding.

Effects

In the semiconductor device according to this seventh embodiment, with respect to the plurality of positions subjected to the ultrasonic bonding on the bonding face 7, vibration directions of the ultrasonic bonding are different from each other at the time of the ultrasonic bonding.

Accordingly, in this seventh embodiment, the vibration directions of the ultrasonic bonding are changed at each position subjected to the ultrasonic bonding and thus directions with weak bonding strength can be dispersed. In other words, the bonding face 7 that is bonded with more uniform strength can be obtained.

In addition, the vibration direction of the ultrasonic bonding is set to a direction different from the direction in which the insulating substrate 1 is vulnerable to vibration, and thus generation of a crack on an insulating substrate 1 can be avoided. In addition, the vibration direction of the ultrasonic bonding is set to a direction in which the electrode terminal 6 is susceptible to a thermal stress, and thus the bonding reliability improves.

Eighth Embodiment

Structure

FIG. 10 is a perspective view of an electrode terminal 6 and a conductive pattern 4b of a semiconductor device according to an eighth embodiment. In the semiconductor device according to this eighth embodiment, the electrode terminal 6 is bonded to the conductive pattern 4b by ultrasonic bonding on one bonding face 7 in the same manner as the first embodiment (FIG. 1 and FIG. 2). This bonding face 7 includes two bonding portions. Two recesses 5a, 5b are generated on the roots of the electrode terminal 6 at the time of the ultrasonic bonding. Here, the recess 5b is formed inside the recess 5a in a plan view. In other words, the ultrasonic bonding is performed twice in such a manner that a bonding portion of the second ultrasonic bonding is overlapped with that of the first ultrasonic bonding.

Effects

On the bonding face 7 of the semiconductor device according to the present embodiment, the ultrasonic bonding is performed a plurality of times in such a manner that positions subjected to the ultrasonic bonding are overlapped with each other in a plan view.

Accordingly, in this eighth embodiment, a plurality of bonding portions subjected to the ultrasonic bonding are provided on one bonding face 7 so as to overlap with each other, and thus a position in which the bonding strength is increased can be provided on the bonding face 7. For example, when an electrode terminal 1 is bonded to a surface including a vicinity of an end surface of the insulating substrate 1, a first ultrasonic bonding is performed with an energy that does not damage the insulating substrate 1, and then a second ultrasonic bonding is performed only around the center of the insulating substrate 1. This prevents the ultrasonic bonding from generating a crack on the insulating substrate 1, and enables obtaining a desired bonding strength.

Ninth Embodiment

Structure

FIG. 11 is a perspective view of an electrode terminal 6 and a conductive pattern 4b of a semiconductor device according to a ninth embodiment. In addition, FIG. 12 is a sectional view taken along line AB in FIG. 11.

In this ninth embodiment, coining is performed at the root of the electrode terminal 6. As shown in FIG. 12, a depression 6e is formed on the upper surface of the root of the electrode terminal 6 and at the same time, a projection 6f is formed on the lower surface of the root of the electrode terminal 6 by the coining.

In addition, on the upper surface of an insulating substrate 1, a depression is provided at a position corresponding to the projection 6f. This depression is formed by a mechanical processing or by an etching. Since the conductive pattern 4b is formed on the surface of the insulating substrate 1, a depression 41b is also formed on the conductive pattern 4b at a position corresponding to the depression on the insulating substrate 1, as shown in FIG. 12.

In fabrication processes, firstly, the electrode terminal 6 is disposed on the conductive pattern 4b. At this time, the projection 6f of the electrode terminal 6 is engaged with the depression 41b of the conductive pattern 4b. Then, a tool is pressed against the upper surface of the electrode terminal 6, and the electrode terminal 6 is bonded to the conductive pattern 4b by ultrasonic bonding. By the ultrasonic bonding, a recess 5 is formed on the upper surface of the root of the electrode terminal 6.

Note that although a projection is formed on the electrode terminal 6 and a depression is formed on the conductive pattern 4b according to the present embodiment, the depression may be formed on the electrode terminal 6 and the projection may be formed on the conductive pattern 4b to engage with the depression.

Effects

The semiconductor device according to this ninth embodiment includes the insulating substrate 1 on which the conductive pattern 4b is formed, and an electrode terminal 6 and a semiconductor element that are bonded to the conductive pattern 4b, the electrode terminal 6 and the conductive pattern 4b are bonded by the ultrasonic bonding on a bonding face 7, the electrode terminal 6 includes a projection 6f and the conductive pattern 4b includes the depression 41b on the bonding face 7, or the electrode terminal 6 includes a depression and the conductive pattern 4b includes a projection on the bonding face, and the projection 6f and the depression 41b are engaged with each other.

In this ninth embodiment, the projection 6f is engaged with the depression 41b. Since the projection 6f and the depression 41b are engaged with each other before performing the ultrasonic bonding, the electrode terminal 6 is easily positioned with respect to the conductive pattern 4b. This stables a relative position of the electrode terminal 6 and the conductive pattern 4b at the time of the ultrasonic bonding, and thus the energy of the ultrasonic bonding can be sufficiently obtained. Since the ultrasonic bonding can be stably performed, a semiconductor device having a high bonding reliability can be obtained.

Tenth Embodiment

Description of Structure

FIG. 13 is a plan view of a semiconductor device according to a tenth embodiment, and a sectional view of the electrode terminal 6 and the conductive pattern 4b.

The semiconductor device according to this tenth embodiment has the same structure as that of the first embodiment (FIG. 1, FIG. 2) except for the shape of a bonding face between the electrode terminal 6 and the conductive pattern 4b.

A projection 6g is formed on the lower surface of the root of the electrode terminal 6. In addition, a depression 42b is formed on the surface of the conductive pattern 4b. The projection 6g has a shape that is engaged with the depression 42b. For example, the projection 6g is formed by mechanical processing, and the depression 42b is formed by etching.

In a fabrication process, firstly, the electrode terminal 6 is formed on the conductive pattern 4b. At this time, the projection 6g of the electrode terminal 6 is engaged with the depression 42b of the conductive pattern 4b. Then, a tool is pressed against the upper surface of the electrode terminal 6, and the electrode terminal 6 is bonded to the conductive pattern 4b by ultrasonic bonding. At this time, the ultrasonic bonding is performed at two positions. Two recesses 5a, 5b are formed on the upper surface of the root of the electrode terminal 6 by the ultrasonic bonding. In this tenth embodiment, the positions subjected to the ultrasonic bonding, the projection 6g, and the depression 42b overlap with each other in a plan view. In other words, two recesses 5a, 5b on the upper surface of the electrode terminal 6, the projection 6g, and the depression 42b overlap with each other in a plan view.

Note that in this embodiment, although a projection is formed on the electrode terminal 6 and a depression is formed on the conductive pattern 4b, the depression may be formed on the electrode terminal 6, a projection may be formed on the conductive pattern 4b to engage with each other. In addition, a plurality of the projections 6g and a plurality of the depressions 42b may be formed. In addition, a corner between the projection 6g and the depression 42b may be smooth.

Effects

In the semiconductor device according to this tenth embodiment, the projection 6g and the depression 42b overlap with the position subjected to the ultrasonic bonding in a plan view.

In this tenth embodiment, the projection 6g is engaged with the depression 42b. The projection 6g and the depression 42b are engaged with each other before performing the ultrasonic bonding, and thus the electrode terminal 6 is easily positioned with respect to the conductive pattern 4b. With this structure, the relative position of the electrode terminal 6 and the conductive pattern 4b are stabled at the time of the ultrasonic bonding, and the energy of the ultrasonic bonding can be sufficiently obtained. In addition, since the depression and the projection are provided at a position subjected to the ultrasonic bonding on the bonding face, the area of the bonding face can be increased, and thus the bonding strength can be increased. In view of the above, a semiconductor device having a high bonding reliability can be obtained.

In addition, in the semiconductor device according to this tenth embodiment, the ultrasonic bonding is performed at a plurality of positions.

Accordingly, the area of each of the bonding portions can be reduced. Therefore, an absolute value of a thermal stress at each of the bonding portions can be reduced, peeling of the bonding face 7 can be suppressed. In addition, since the total area of the bonding portions is increased, a highly reliable semiconductor device can be obtained.

Although this invention is described in detail, the above descriptions are examples in all aspects, and this invention is not limited to that extent. Unlimited number of modifications that are not exemplified can be estimated without deviating from the scope of this invention.

REFERENCE SIGNS LIST

1: insulating substrate,
2: MOSFET chip
3: SBD chip
4a, 4b, 4c: conductive pattern
5, 5a, 5b, 5c, 5d: recess
6: electrode terminal
6a, 6b, 6c, 6d: branch
7, 7a, 7b, 7c, 7d: bonding face
8: bonding member
9: sealing member
10: outsert case
11: base plate
12: adhesive agent
13: tool
14: metal wire.

The invention claimed is:

1. A semiconductor device manufacturing method comprising the steps of:
   disposing an electrode terminal on a conductive pattern which is formed on an insulating substrate; and
   bonding the electrode terminal and the conductive pattern together by ultrasonic bonding,
   wherein in the step of bonding the electrode terminal and the conductive pattern together, the electrode terminal and the conductive pattern are bonded together through a bonding face, and the ultrasonic bonding is performed at a plurality of positions on the bonding face,
   with respect to the plurality of positions on the bonding face subjected to the ultrasonic bonding, vibration directions of the ultrasonic bonding are different from each other, and
   the ultrasonic bonding is performed twice such that a bonding portion of a first ultrasonic bonding overlaps a bonding portion of a second ultrasonic bonding.

* * * * *